(12) United States Patent
Jang et al.

(10) Patent No.: US 7,962,989 B2
(45) Date of Patent: Jun. 21, 2011

(54) APPARATUS FOR CLEANING FLAT PANEL DISPLAY AND ROLL BRUSH USED THEREIN

(75) Inventors: Kyung-Duk Jang, Chungcheongnam (KR); Eui-Sik In, Chungcheongnam-do (KR); Sung-Hee Lee, Chungcheongnam-do (KR)

(73) Assignee: Semes Co., Ltd. (KR)

( * ) Notice: Subject to any disclaimer, the term of this patent is extended or adjusted under 35 U.S.C. 154(b) by 1048 days.

(21) Appl. No.: 11/810,754

(22) Filed: Jun. 7, 2007

(65) Prior Publication Data

US 2007/0283513 A1      Dec. 13, 2007

(30) Foreign Application Priority Data

Jun. 12, 2006   (KR) .................. 10-2006-0052501

(51) Int. Cl.
   *B08B 1/02*   (2006.01)
(52) U.S. Cl. ................. 15/77; 15/88.3; 15/102
(58) Field of Classification Search ............. 15/77, 88.3, 15/102, 88.2, 88.1
   See application file for complete search history.

(56) References Cited

U.S. PATENT DOCUMENTS

| 4,947,029 A | * | 8/1990 | Kurihara et al. | ............. 235/475 |
| 6,851,151 B1 | * | 2/2005 | Pena | ............. 15/77 |

FOREIGN PATENT DOCUMENTS

| JP | 10335279 A | 12/1998 |
| JP | 2002327764 A | 11/2002 |
| JP | 2005052834 A | 3/2005 |
| JP | 2005056230 A | 3/2005 |
| JP | 2006073938 A | 3/2006 |
| KR | 10-2007-0000366 | 1/2007 |

OTHER PUBLICATIONS

Office Action for the corresponding Japanese patent application No. 2007-45153 issued Nov. 4, 2009.
Office Action issued Apr. 15, 2009 during examination of the corresponding Japanese patent application No. 2007-45153.

* cited by examiner

*Primary Examiner* — Shay L Karls
(74) *Attorney, Agent, or Firm* — Myers Bigel Sibley & Sajovec, P.A.

(57) ABSTRACT

An apparatus for cleaning a flat panel display and a roll brush used therein are provided. The apparatus includes an internal wall, hollow cylindrical joint parts, each of which is joined with the internal wall and having an opening therein, and roll brushes, each of which includes a rotation shaft passing through the opening of the hollow cylindrical joint part, a hollow cylindrical liquid blocking member integrated with the rotation shaft to have an inner diameter larger than an outer diameter of the joint part, and a brush.

15 Claims, 6 Drawing Sheets

FIG. 1

Prior Art

APPARATUS FOR CLEANING FLAT PANEL DISPLAY AND ROLL BRUSH USED THEREIN

CROSS REFERENCE TO RELATED APPLICATION

This application claims priority from Korean Patent Application No. 10-2006-0052501 filed on Jun. 12, 2006, in the Korean Intellectual Property Office, the disclosure of which is incorporated herein by reference in its entirety.

BACKGROUND OF THE INVENTION

1. Field of the Invention

The present invention relates to an apparatus for cleaning a flat panel display and a roll brush used therein, and more particularly, to an apparatus for cleaning a flat panel display in which internal mist is prevented from leaking outside, and to a roll brush used therein.

2. Description of the Related Art

A cleaning process is a critical process for electronic equipment which requires delicate processing including a semiconductor manufacturing process. In particular, a process of cleaning a flat panel display, which is a technical field of the invention, is implemented as the flat panel display moves between a pair of upper and lower roll bushes, while cleaning liquid is sprayed thereon through a nozzle (not shown), and the roll brushes brush or scrub the flat panel display.

An apparatus for cleaning a flat panel display and a roll brush used therein according to a related art will be described with reference to FIG. 1.

Figure 1:
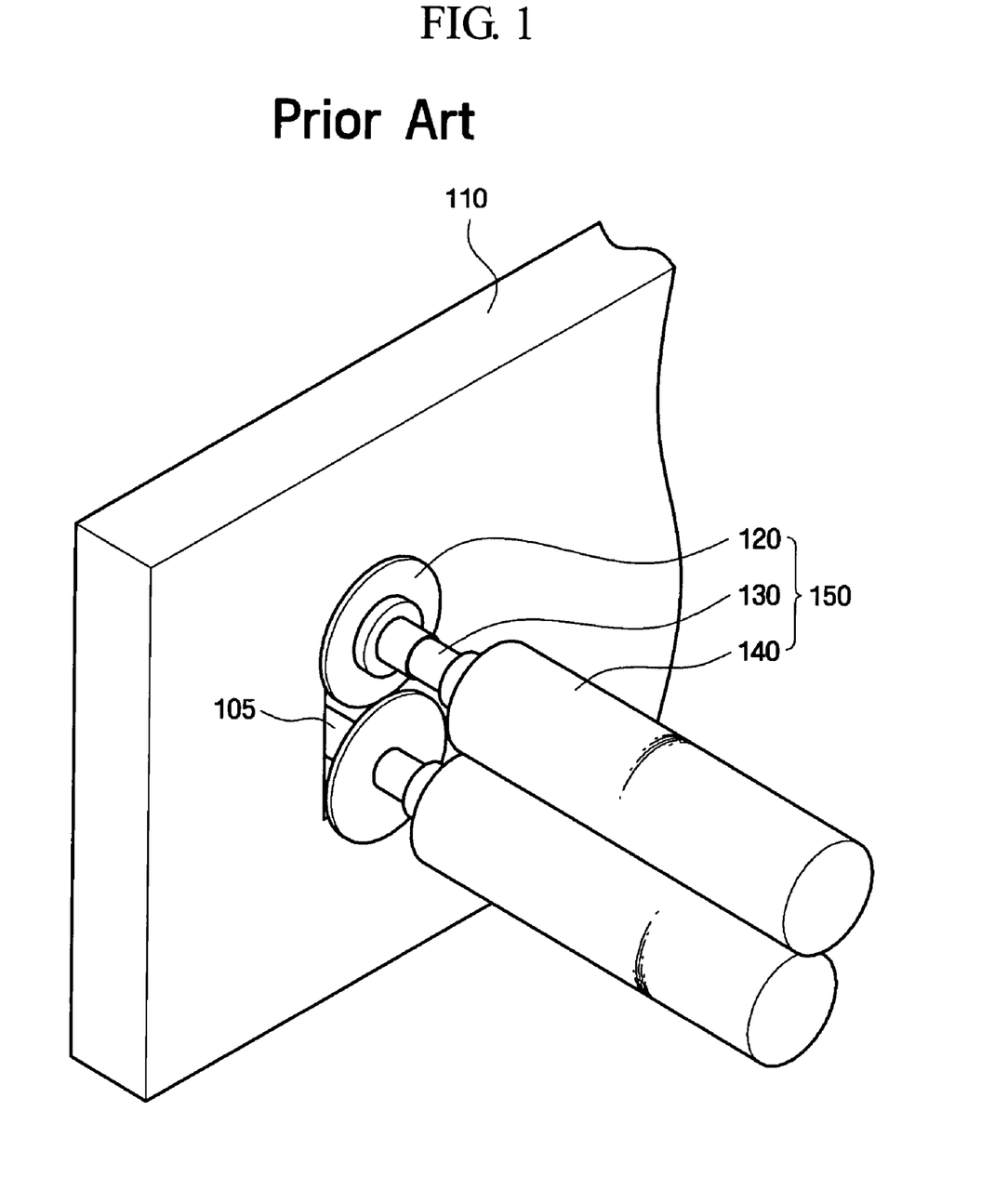
FIG. 1 is a view showing an apparatus for cleaning a flat panel display and a roll brush according to the related art.

FIG. 1 is a view showing an apparatus for cleaning a flat panel display and a roll brush 150 according to a related art.

Referring to FIG. 1, the apparatus for cleaning a flat panel display according to the related art includes liquid blocking members 120 that are rotatably located at an internal wall 110, rotation shafts 130 that are rotatably integrated with the liquid blocking members 120, and brushes 140 that are formed at body portions of the rotation shafts 130. The roll brush 150 of the apparatus for cleaning a flat panel display according to the related art moves vertically. For this reason, the liquid blocking members 120 at the internal wall 110 are alternately located, and it is necessary to provide an opening 105 in the internal wall 110 to allow the rotation shafts 130 of the roll brushes 150 and the liquid blocking members 120 to move.

According to the related art, it is necessary to provide the opening 105 in the internal wall 110 to allow the apparatus for cleaning a flat panel display and the roll brush 150 to move vertically. Accordingly, the mist generated during a process of cleaning the flat panel display leaks outside through the opening 150. The mist that leaked outside affects equipment of bearings of the apparatus for cleaning a flat panel display, and on a broader scale, other equipment of other processes. Particularly, the mist causes metallic materials to corrode. Further, the mist is mixed with air and floats, which can affect manufacturing lines which require chemical stability and other processes. Since the cleaning liquid has to remove dust particles formed on the surface of the flat panel display or organic remnants, the cleaning liquid is acid or alkaline, which has strong reactivity according to its kinds. Particularly, if the cleaning liquid has high polarity, it affects only process equipment but also the human body. Therefore, it is necessary to prevent the mist from leaking into the manufacturing lines. However, since the opening 105 is necessary for the apparatus for cleaning a flat panel display according to the related art, it is impossible to prevent equipment corrosion and air pollution.

SUMMARY OF THE INVENTION

An object of the invention is to provide an apparatus for cleaning a flat panel display in which internal mist is prevented from leaking outside and a roll brush used therein.

Objects of the invention are not limited to the above-mentioned objects, and other objects of the invention will be apparently understood by those skilled in the art through the following description.

According to an aspect of the invention, there is provided an apparatus for cleaning a flat panel display, the apparatus including an internal wall, hollow cylindrical joint parts, each of which is joined with the internal wall and having an opening therein, and roll brushes, each of which includes a rotation shaft that passes through the opening of the hollow cylindrical joint part, a hollow cylindrical liquid blocking member integrated with the rotation shaft to have an inner diameter larger than an outer diameter of the joint part, and a brush.

The rotation shaft may be horizontally located, and vertically movable.

An interval between an outer diameter of the joint part and an inner diameter of the liquid blocking member may be set to be equal to the vertically movable range of the roll brush.

The internal wall may include a through hole for the rotation shaft to pass therethrough.

The apparatus for cleaning a flat panel display may further include driving parts, each of which is provided at one end of the rotation shaft. The driving part may be located outside the internal wall, and may drive the rotation shaft by a motor and a driving belt.

The liquid blocking member may be located at an outer end part of the roll brush.

The apparatus for cleaning a flat panel display may further include bearings between the joint parts and the rotation shafts.

The apparatus for cleaning a flat panel display may further include fans provided outside the liquid blocking members.

As the fan rotates together with the roll brush, it may generate air currents inward from the internal wall.

The fan may include a plurality of wings, and may be screwed to the liquid blocking member or inserted into a groove formed at the outside of the liquid blocking member so as to be attached to and detached from the liquid blocking member.

The roll brushes may make a pair so as to be located at upper and lower sides. In the pair of roll brushes, a length from a body part of a first roll brush to a horizontal end part of the liquid blocking member may be smaller than a length from a body part of a second roll brush to a horizontal start part of the liquid blocking member.

According to a second aspect of the invention, there is provided an apparatus for cleaning a flat panel display, the apparatus including a cylindrical first rotation shaft, a first hollow cylindrical joint part having an opening for the first rotation shaft to pass therethrough, a first hollow cylindrical liquid blocking member being located at a first position of the first rotation shaft so as to be integrated with the first rotation shaft, and having a larger inner diameter than an outer diameter of the first hollow cylindrical joint part, a first roll brush having a first brush located at a body part, a cylindrical second rotation shaft, a second hollow cylindrical joint part having an opening for the second rotation shaft to pass therethrough, a second hollow cylindrical liquid blocking member being located at a second position of the second rotation shaft so as to be integrated with the second rotation shaft, and having a larger inner diameter than an outer diameter of the second hollow cylindrical joint part, and a second roll brush including a second brush located at a body part.

A length from a body part of the first roll brush to an end of the first liquid blocking member may be smaller than a length from a body part of the second roll brush to a start end of the second liquid blocking member.

The apparatus for cleaning a flat panel display may further include fans provided outside the liquid blocking members.

As the fan rotates together with the roll brush, it may generate air currents inward from the internal wall.

The fan may include a plurality of wings, and may be screwed to the liquid blocking member or inserted into a groove formed at the outside of the liquid blocking member so as to be attached to and detached from the liquid blocking member.

According to a third aspect of the invention, there is provided a roll brush including a cylindrical rotation shaft, a hollow cylindrical joint part having an opening for the rotation shaft to pass therethrough, a hollow cylindrical liquid blocking member being located at an outer end so as to be integrated with the rotation shaft, and having a larger inner diameter than an outer diameter of the joint part, and a brush being located at a body part.

An interval between the outer diameter of the joint part and the inner diameter of the liquid blocking member may be equal to a vertically movable range of the roll brush.

The roll brush may further include a fan provided outside the liquid blocking member.

As the fan rotates together with the roll brush, it may generate air currents inward from the internal wall.

The fan may include a plurality of wings, and may be screwed to the liquid blocking member or inserted into a groove formed at the outside of the liquid blocking member so as to be attached to and detached from the liquid blocking member.

BRIEF DESCRIPTION OF THE DRAWINGS

The above and other features and advantages of the invention will become more apparent by describing in detail preferred embodiments thereof with reference to the attached drawings, in which.

DETAILED DESCRIPTION OF PREFERRED EMBODIMENTS

Advantages and features of the invention and methods of accomplishing the same may be understood more readily by reference to the following detailed description of preferred embodiments and the accompanying drawings. The invention may, however, be embodied in many different forms and should not be construed as being limited to the embodiments set forth herein. Rather, these embodiments are provided so that this disclosure will be thorough and complete and will fully convey the concept of the invention to those skilled in the art, and the invention will only be defined by the appended claims. Like reference numerals refer to like elements throughout the specification.

Hereinafter, the invention will now be described more fully with reference to the accompanying drawings, in which preferred embodiments of the invention are shown.

Figure 2:
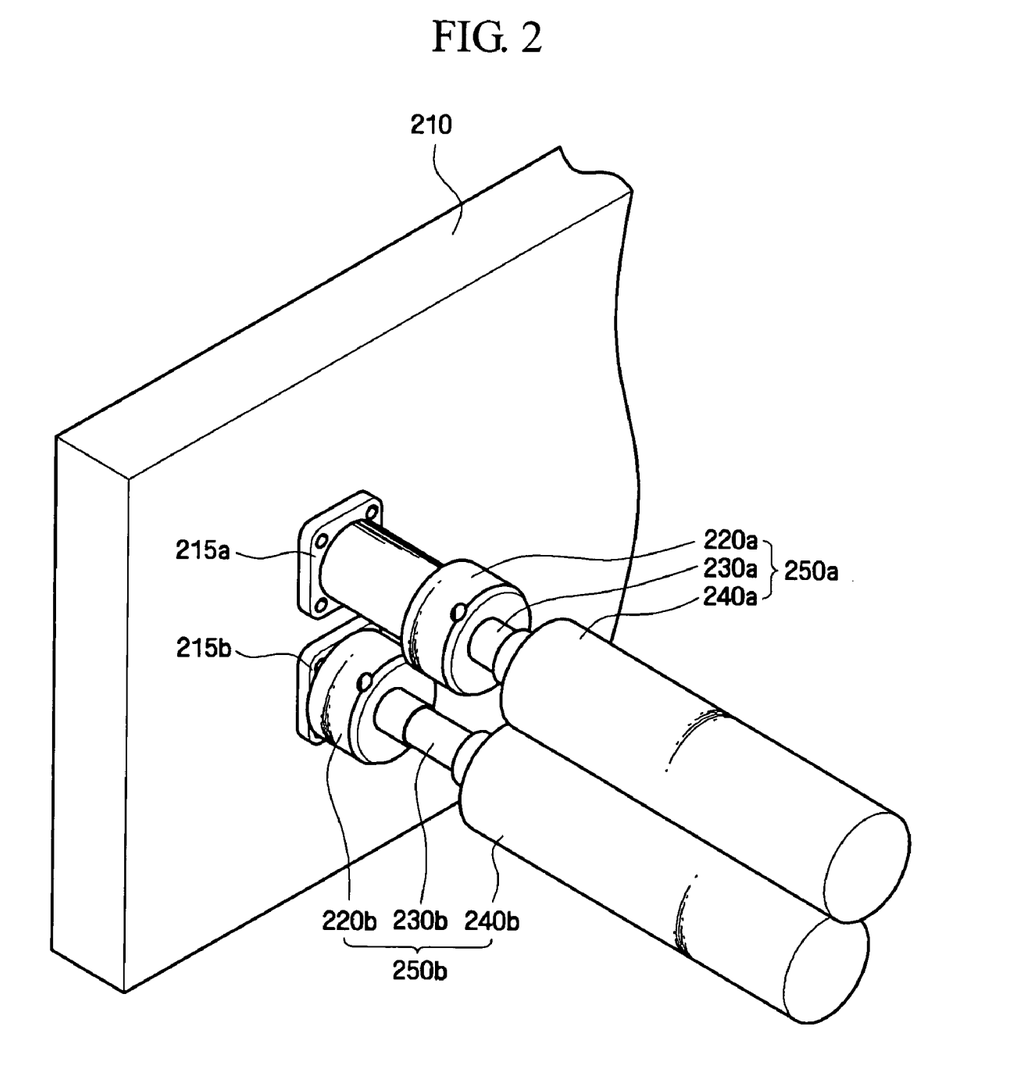
FIG. 2 is a perspective view schematically showing an apparatus for cleaning a flat panel display according to an embodiment of the invention.

FIG. 2 is a perspective view schematically showing an apparatus for cleaning a flat panel display according to an embodiment of the invention. The apparatus for cleaning a flat panel display according to the embodiment of the invention will be understood more fully with reference to FIGS. 3A to 5.

Referring to FIG. 2, the apparatus for cleaning a flat panel display according to the embodiment of the invention includes an internal wall 210, hollow cylindrical joint parts 215a and 215b whose inside is hollow and which are joined to the internal wall 210, rotation shafts 230a and 230b which penetrate the cylindrical joint parts 215a and 215b, hollow cylindrical liquid blocking members 220a and 220b which are integrated with the rotation shafts 230a and 230b and each of which has a larger inner diameter Din than an outer diameter Dout of the hollow cylindrical portion of the joint parts 215a and 215b, and roll brushes 250a and 250b having brushes 240a and 240b in a body part B. A plurality of roll rushes 250a and 250b may be provided and, particularly, two roll brushes 250a and 250b are vertically provided to make a pair.

The joint parts 215a and 215b may be integrated with the internal wall 210. The rotation shafts 230a and 230b can pass through the joint parts 215a and 215b, and each of the joint parts 215a and 215b may further include a hollow cylindrical portion 217 whose inside is hollow. Each of the joint parts 215a and 215b may further include a panel part 216 shown FIG. 3A to be fastened to the internal wall 210. The panel part 216 may be fixed to the internal wall 210 by a joint means including a screw, a rivet, a nail, etc. Alternatively, the panel part may be fixed thereto by using adhesives or a method like welding. The length of the hollow cylindrical portion 217 can be set in accordance with liquid blocking members 220a and 220b of the roll brushes 250a and 250b, to be described later, but the length is not limited to a specific value. The joint parts 215a and 215b will be understood more fully with reference to FIG. 3A.

The roll brushes 250a and 250b include the rotation shafts 230a and 230b, the liquid blocking members 220a and 220b, and the brushes 240a and 240b, respectively. Each of the roll brushes 250a and 250b are divided into an outer end part A and a body part B. In the outer end parts A, the rotation shafts 230a and 230b, and the liquid blocking members 220a and 220b are exposed. In the body parts B, the brushes 240a and 240b are formed.

The rotation shafts 230a and 230b of the roll brushes 250a and 250b are formed in a cylindrical shape which passes through the internal wall 210 and the inside of the hollow cylindrical portions 217 of the joint parts 215a and 215b, and are located horizontally inside the apparatus for cleaning a flat panel display.

The roll brushes 250a and 250b are vertically movable, that is, in a vertical direction with respect to the ground. The reason why they are vertically movable with respect to the ground is that the flat panel display needs to pass between the pair of roll brushes 250a and 250b, and the roll brushes 250a and 250b can vertically move within the range of the thickness of the flat panel display that the roll brushes 250a and 250b clean. Since the thickness of the flat panel display varies according to the kind of product, the movable range of the roll brushes 250a and 250b varies according to the kind of flat panel display. In addition, in order to decrease an error in arrangement of the roll brushes, one of the pair of roll brushes 250a and 250b is fixed while the other is movable. For example, the lower roll brush 250b may be fixed while the upper roll brush 250a may be vertically movable. In contrast, the upper roll brush 250a can be fixed, while the lower roll brush 250b is vertically movable.

The roll brushes 250a and 250b may have resilience so as to be variously movable in accordance with the thickness of the flat panel display. Specifically, as for an initial position when the flat panel display does not pass between the roll brushes 250a and 250b, the two roll brushes 250a and 250b are in contact with each other or distanced from each other by a minute interval. In contrast, when the flat panel display passes between the roll brushes 250a and 250b, the roll brushes 250a and 250b can be distanced from each other according to the thickness of the flat panel display, and the roll brushes 250a and 250b may return to the initial position due to a resilient body, such as a spring, after the flat panel display passes between the roll brushes 250a and 250b. When the lower roll brush 250b is fixedly applied, the upper roll brush 250a is moved up by the flat panel display and moved down by gravity without a resilient body.

The apparatus for cleaning a flat panel display may further include bearings 270 (see FIGS. 4 and 5) between the joint parts 215a and 215b and the rotation shafts 230a and 230b. To be more specific, the bearings may exist between the hollow cylindrical portions 217 of the joint parts 215a and 215b and the rotation shafts 230a and 230b. The bearing 270 can be fully understood with reference to FIGS. 4 and 5.

The roll brushes 250a and 250b may include the liquid blocking members 220a and 220b at the outer end part A thereof.

Each of the liquid blocking members 220a and 220b may be formed in a hollow cylindrical shape which is horizontally positioned. Particularly, the liquid blocking members 220a and 220b may be respectively fixed to the rotation shafts 230a and 230b or integrated therewith, and have a structure in which one side is closed. Cylindrical unclosed parts of the liquid blocking members may be formed so as to surround the joint parts 215a and 215b or the hollow cylindrical portions 217 of the joint parts. That is, an inner diameter Din of the unclosed part is formed larger than an outer diameter Dout of the joint parts 215a and 215b or of the hollow cylindrical portions 217 of the joint parts, so that the joint parts 215a and 215b or the hollow cylindrical portions 217 of the joint parts can be inserted into the liquid blocking members 220a and 220b. In this case, the liquid blocking members 220a and 220b are not physically in contact with the joint parts 215a and 215b, and are spaced apart from the joint parts by an interval. The interval may be preferably several millimeters, and a horizontal interval is independent from a vertical interval. For example, the horizontal interval between the liquid blocking members 220a and 220b and the joint parts 215a and 215b ranges from 0.2 to 0.4 cm, and the vertical interval therebetween ranges from 0.4 to 0.8 cm. In addition, the vertical interval between the inner diameter Din of the liquid blocking members 220a and 220b and the outer diameter Dout of the joint parts 215a and 215b may be equal to the vertically movable distance of the roll brushes 250a and 250b.

A horizontal length of the hollow cylindrical parts of the liquid blocking members 220a and 220b is not necessarily limited. However, the longer the length is, the more advantageous the outcome of the invention is.

Each of the rotation shafts 230a and 230b may further include a driving part 260 at one end thereof. That is, each of the rotation shaft 230a and 230b further includes the driving part 260 at one end thereof which extends outside of the internal wall 210, and the driving part 260 transfers a rotational force to the one end of the rotation shaft through a driving belt b. For example, the driving part 260 may be located outside of the internal wall 210, and include a motor M which generates a rotational force. When the driving part 260 is included, through holes h (refer to FIG. 5) are formed in the internal wall 210 such that the rotation shafts 230a and 230b are arranged. The through hole h and the driving part 260 will be described in detail with reference to FIG. 4.

The liquid blocking members 220a and 220b of the roll brushes 250a and 250b are located at positions with different distances in respect to the body part B, so that the liquid blocking members 220a and 220b do not collide with each other and move alternately when the roll brushes 250a and 250b move up and down. To be more specific, the roll brushes 250a and 250b may have the same length of the body part B. A length L1 from the body part B of the upper roll brush 250a to a horizontal end part of the liquid blocking member 220a may be smaller than a length L2 from the body part B of the lower roll brush 250b to a horizontal start part of the liquid blocking member 220b. In contrast, a length from the body part B of the lower roll brush 250b to a horizontal end part of the liquid blocking member 220b may be smaller than a length from the body part B of the upper roll brush 250a to a horizontal start part of the liquid blocking member 220b. The structure of the liquid blocking members 220a and 220b will be understood more fully with reference to FIG. 3B.

Each component can be manufactured by using a metal, such as stainless steel.

Figure 3A:
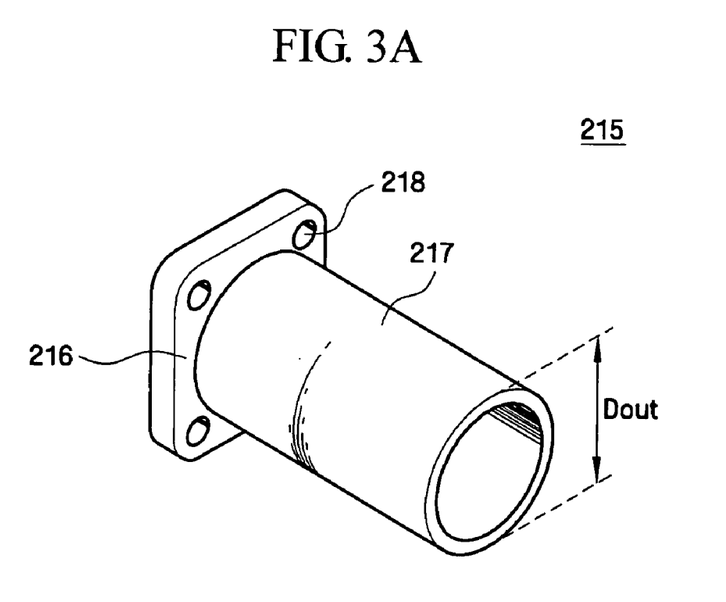
FIG. 3A is a perspective view schematically showing a joint part used in an apparatus for cleaning a flat panel display and a roll brush according to an embodiment of the invention.

FIG. 3A is a perspective view schematically showing a joint part 215 used in the apparatus for cleaning a flat panel display and the roll brushes 250a and 250b according to the embodiment of the invention.

Referring to FIG. 3A, the joint part 215 used in the apparatus for cleaning a flat panel display and the roll brushes 250a and 250b according to the embodiment of the invention includes the panel part 216 and the hollow cylindrical portion 217. As described above with reference to FIG. 2, the panel part 216 is fixed to the internal wall 210. In order to make known that the panel can be fixed thereto by means of a joint means, such as a screw, a rivet, a nail, etc., holes 218 are shown in the drawing. However, the means are examples, and the panel can be fixed to the internal wall 210 by adhesives without using the joint means, or integrated with the internal wall 210. If the through holes h are formed in the internal wall 210, the hollow cylindrical portion 217 and the through hole h align with each other.

Figure 3B:
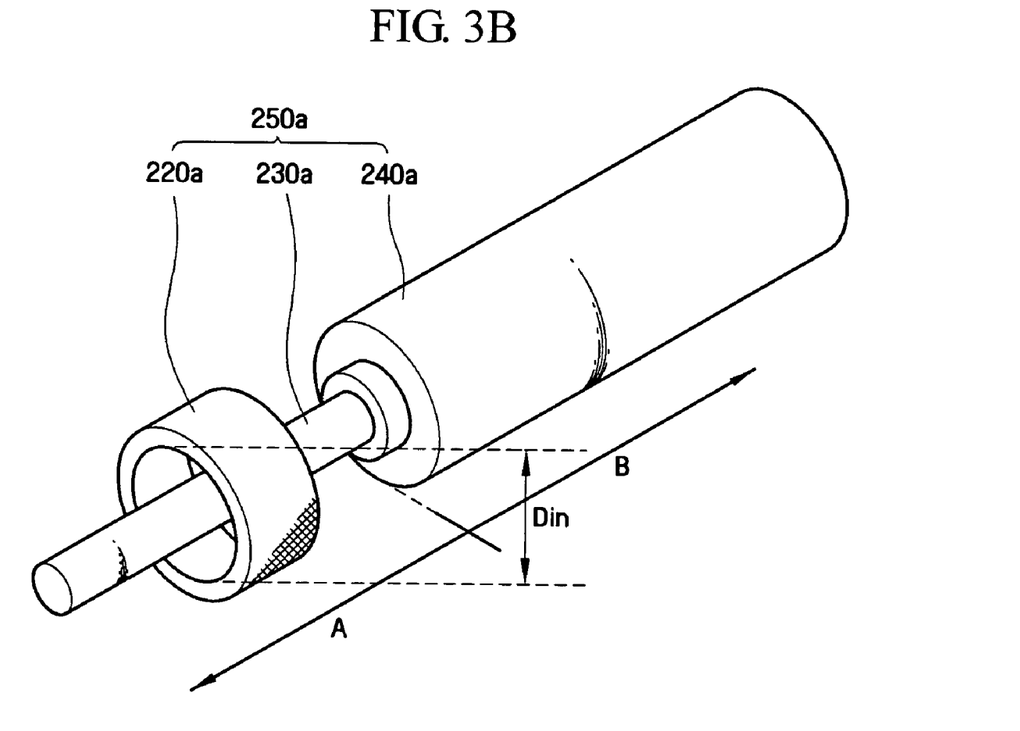
FIG. 3B is a perspective view schematically showing a roll brush according to the embodiment of the invention.

FIG. 3B is a perspective view schematically showing the roll brushes 250a and 250b according to the embodiment of the invention.

Referring to FIG. 3B, the roll brush 250a according to the embodiment of the invention includes the cylindrical rotation shaft 230a, the hollow cylindrical liquid blocking member 220a, and the brush 240a. The hollow cylindrical liquid blocking member 220a is located at the outer end part A to be integrated with the rotation shaft 230a, and has a larger inner diameter Din than an outer diameter Dout of the hollow cylindrical portion 217 of the joint parts 215a and 215b. The brush 240a is located at the body part B.

The liquid blocking member 220a is fixed to the rotation shaft 230a or integrated therewith, and one side thereof is closed. To be more specific, the liquid blocking member is closed in the body part B direction, and opened in the outer end part A direction.

The inner diameter Din of the liquid blocking member 220a is larger than the outer diameter Dout of the joint parts 215a and 215b.

If the through hole h is formed in the internal wall 210, the rotation shaft 230a can pass through the through hole h so as to be mechanically connected to the outside driving part 260 and thus rotate. The driving part 260 will be described in detail below with reference to FIG. 4.

Figure 3C:
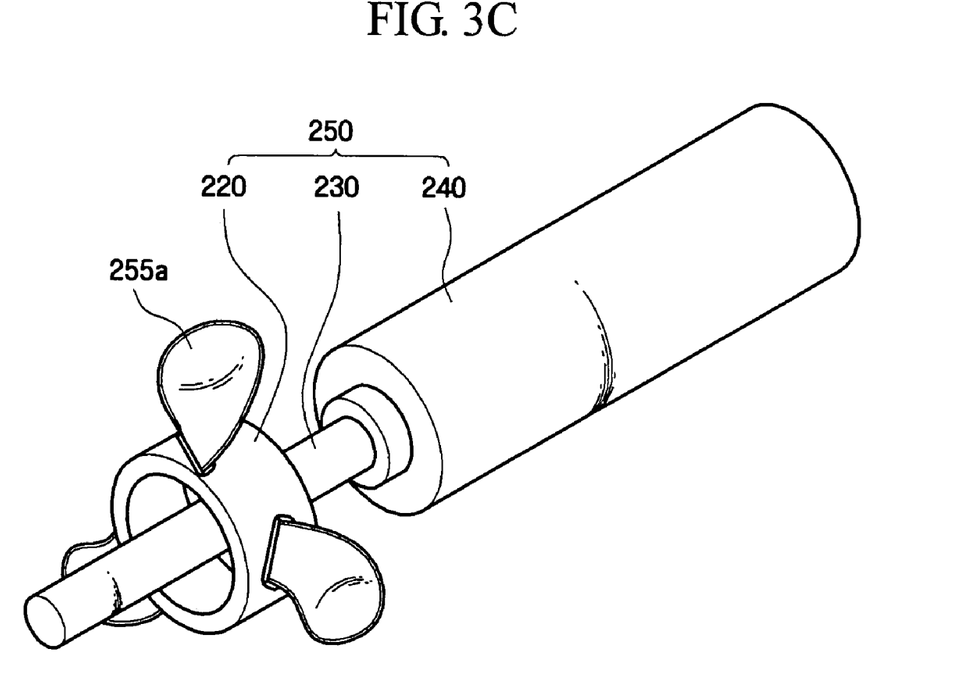
FIG. 3C is a perspective view schematically showing a roll brush according to another embodiment of the invention.

FIG. 3C is a perspective view schematically showing a roll brush according to another embodiment of the invention.

Referring to FIG. 3C, the roll brush 250 according to another embodiment of the invention includes a cylindrical rotation shaft 230, a hollow cylindrical liquid blocking member 220, a brush 240, and fans 255a. The fans 255a may be formed winged type shape. The hollow cylindrical liquid blocking member 220 is located at the outer end part A to be integrated with the rotation shaft 230, and has a larger inner diameter Din than an outer diameter Dout of the hollow cylindrical portion 217 of the joint part 215. The brush 240 is located at the body part B. The fans 255a are located outside the liquid blocking member 220.

The fan 255a rotates with the roll brush 250, and generates air currents inward from the internal wall 210 of the apparatus for cleaning a flat panel display. The air currents generated by the fan 255a may prevent mists to be generated inside the apparatus for cleaning a flat panel display from moving toward the internal wall 210. Therefore, the mists are prevented from leaking through a gap between the internal wall 210 and the roll brush 250, more specifically, through a gap between the rotation shaft 230 and the joint part 215.

The number and shape of wings included in the fan 255a is not specifically limited, but the wings are designed to have a large as possible plane area as long as they do not cause a collision with other wings of another roll brush, in order to prevent the mists from leaking more efficiently. That is, the wings prevent the mist or liquid from splashing on the surface of the internal wall 210.

In addition, since the roll brush 250 can rotate at upper and lower sides of the flat panel display, it rotates in an opposite direction to the rotation of the fan 255a. More particularly, FIG. 3c shows a case in which the roll brush 250 rotates in a clockwise direction. If the roll brush 250 rotates in a counterclockwise direction, the fan 255a may rotate clockwise.

The fan 255a can be integrated with the liquid blocking member 220, but it can be manufactured so as to be detachable from the liquid blocking member 220. For example, the fan can be fixed to the liquid blocking member by a screw or the like. Alternatively, a hole is formed at an outer side of the liquid blocking member 220, and the fan is inserted into the hole so as to be fixed to the liquid blocking member. The methods of mounting the fan 255a to the outside of the liquid blocking member 220 can be carried out by those skilled in this field, and thus the detailed description of the methods will be omitted.

Figure 3D:
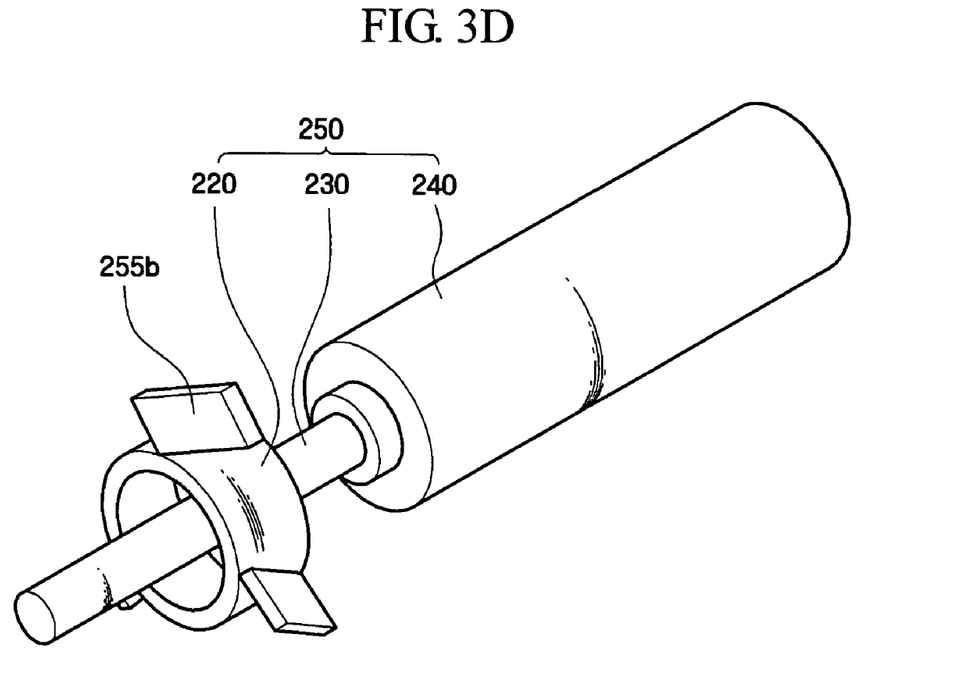
FIG. 3D is a perspective view schematically showing a roll brush according to the another embodiment of the invention.

FIG. 3D is a perspective view schematically showing a roll brush according to another embodiment of the invention.

Referring to FIG. 3D, the roll brush 250 according to another embodiment of the invention includes a cylindrical rotation shaft 230, a hollow cylindrical liquid blocking member 220, a brush 240, and finned fans 255b.

The finned fans (255b) may be formed in variance such as polygonal and/or circular not limited rectangular in FIG. 3D. The finned fans (255b) may be smaller than the winged fans (255a). Therefore, it is easy to manufacture, maintain and repair.

Figure 4:
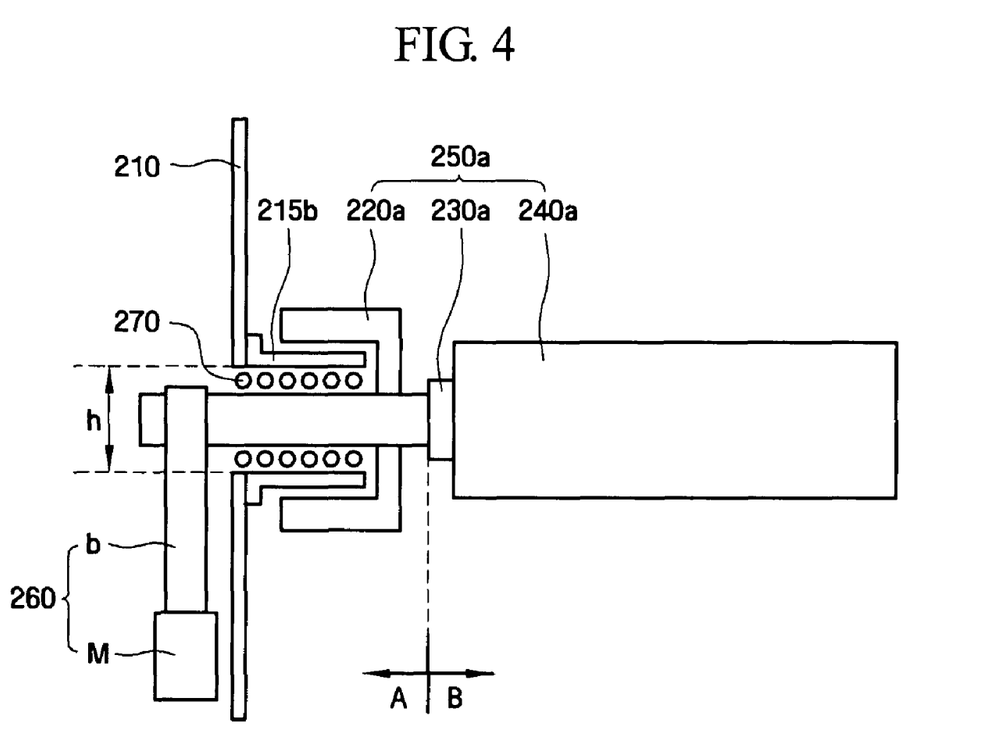
FIG. 4 is a longitudinal sectional view schematically showing a roll brush of an apparatus for cleaning a flat panel display according to an embodiment of the invention.

FIG. 4 is a longitudinal sectional view schematically showing the roll brush 250a of the apparatus for cleaning a flat panel display according to an embodiment of the invention. Only one roll brush 250a is illustrated to better understand the invention, and how the roll brush 250a is joined with the internal wall 210 of the apparatus for cleaning a flat panel display according to the embodiment of the invention is also illustrated in the drawing. Particularly, the internal wall 210 includes the through hole h.

Referring to FIG. 4, the roll brush 250a of the apparatus for cleaning a flat panel display according to the embodiment of the invention includes the cylindrical rotation shaft 230a, the hollow cylindrical joint part 215a, the hollow cylindrical liquid blocking member 220a, and the brush 240a. The hollow cylindrical joint part 215a has an opening through which the rotation shaft 230a passes. The hollow cylindrical liquid blocking member 220a is located at the outer end part A so as to be integrated with the rotation shaft 230a, and has a larger inner diameter Din than an outer diameter Dout of the joint parts 215a. The brush 240a is located at the body part B.

The rotation shaft 230a extends outside of the apparatus for cleaning a flat panel display to be driven by the driving part 260.

The driving part 260 may include the motor M which generates a rotational force, and transfer the rotational force to the rotation shaft 230a by using the driving belt b.

The liquid blocking member 220a may be located at an outer end part A of the roll brush 250a, and may be a hollow circular shape. The liquid blocking member 220a may be fixed to the rotation shaft 230a or integrated therewith, and has a structure in which the fixed or integrated side of the liquid blocking member is closed. A cylindrical unclosed part of the liquid blocking member may be formed so as to surround the hollow cylindrical portion 217 of the joint part 215a. That is, an inner diameter Din of the unclosed part is formed larger than an outer diameter Dout of the hollow cylindrical portion 217 of the joint part 215a, so that the joint part 215a can be inserted into the liquid blocking member 220a. In this case, the liquid blocking member 220a is not physically in contact with the joint part 215a, and is distanced from the joint part by an interval.

The interval between the outer diameter Dout of the joint part 215a and the inner diameter Din of the liquid blocking member 220a may be equal to a vertically movable range of the roll brush 250a.

The apparatus for cleaning a flat panel display may further include bearings 270 between the joint part 215a and the rotation shaft 230a. In the drawing, although a section view of a ball bearing is illustrated, the bearing is not limited thereto; the bearing can be a roller bearing.

Figure 5:
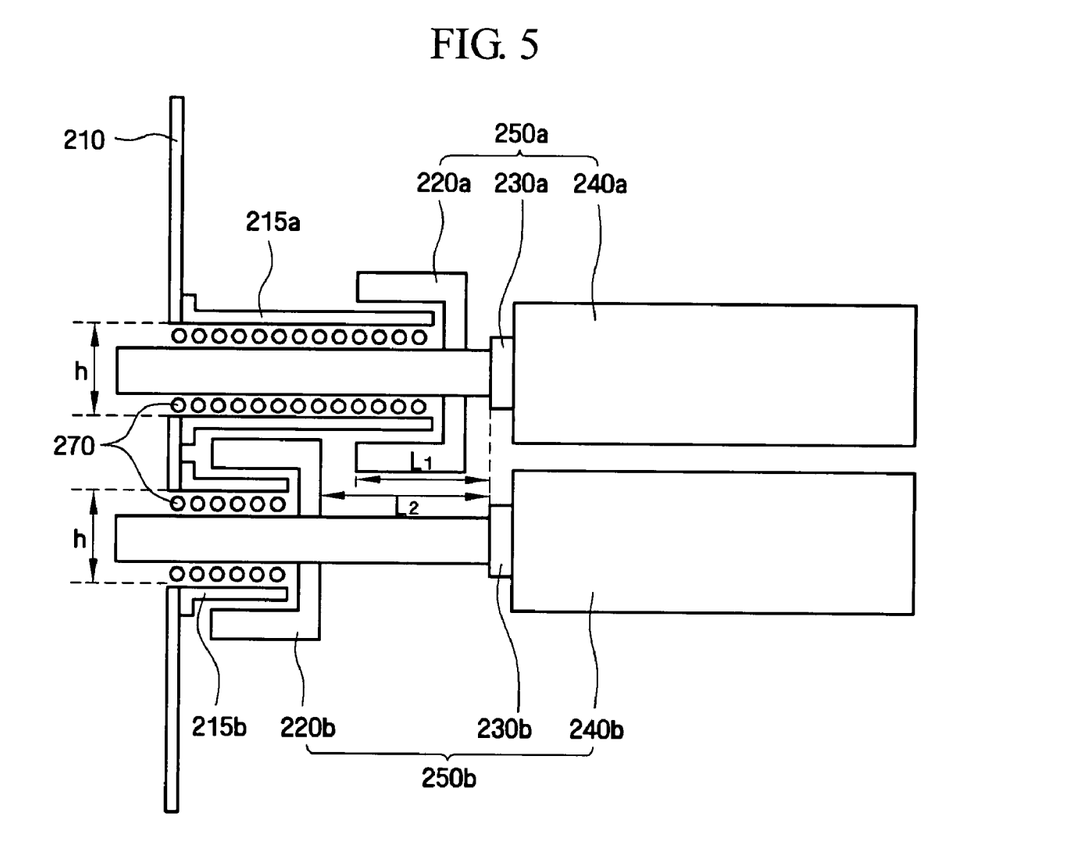
FIG. 5 is a longitudinal sectional view schematically showing a pair of roll brushes according to another embodiment of the invention.

FIG. 5 is a longitudinal sectional view schematically showing a pair of roll brushes 250a and 250b according to another embodiment of the invention.

Referring to FIG. 5, the roll brushes 250a and 250b according to another embodiment of the invention include the upper roll brush 250a and the lower roll brush 250b. A length L1 from the body part B of the upper roll brush 250a to an end part of the liquid blocking member 220a may be smaller than a length L2 from the body part B of the lower roll brush 250*b* to a start part of the liquid blocking member 220*b*. The internal wall 210 includes the through hole h in FIG. 5, and the driving part 260 is omitted to make the drawing simple. Other components can be understood with reference to FIG. 4.

While the roll brushes 250*a* and 250*b* shown in FIG. 5 cleans the flat panel display, even when one of the roll brushes 250*a* and 250*b* moves up and down, the liquid blocking members 220*a* and 220*b* do not collide with each other.

Although the invention has been described in connection with the exemplary embodiments of the invention with reference to the accompanying drawings, it will be apparent to those skilled in the art that various modifications and changes may be made thereto without departing from the scope and spirit of the invention. Therefore, it should be understood that the above embodiments are not limitative, but illustrative in all aspects.

When the apparatus for cleaning a flat panel display and the roll brush according to the embodiments of the invention performs a cleaning process of the flat display panel, the internal wall of the apparatus for cleaning a flat panel display does not have a gap, so that mists generated inside the apparatus for cleaning a flat panel display are prevented from leaking outside. Therefore, bearing and other components are not affected by the mists, and thus lifespan of equipment and components is extended.

The effects of the invention are not limited to the above-described effects, and other effects will be clearly understood to those skilled in the art by the appended claims.

What is claimed is:

1. An apparatus for cleaning a flat panel display, the apparatus comprising:
   an internal wall;
   hollow cylindrical joint parts, each of which is joined with the internal wall and having an opening therein; and
   roll brushes, each of which comprises a rotation shaft passing through the opening of the hollow cylindrical joint part, a hollow cylindrical liquid blocking member integrated with the rotation shaft to have an inner diameter larger than an outer diameter of the joint part, and a brush, wherein the liquid blocking member is in non-contacting, spaced apart relationship with the joint part.

2. The apparatus of claim 1, wherein the internal wall comprises a through hole for the rotation shaft to pass therethrough.

3. The apparatus of claim 1, further comprising driving parts, each of which is provided at one end of the rotation shaft.

4. The apparatus of claim 1, wherein the liquid blocking member is located at an outer end part of the roll brush.

5. The apparatus of claim 1, further comprising fans provided outside the liquid blocking members.

6. The apparatus of claim 5, wherein the fan comprises a plurality of wings, and the fan is attached to and detached from the liquid blocking member.

7. The apparatus of claim 1, wherein:
   the roll brushes, make a pair so as to be located at upper and lower sides; and
   in the pair of roll brushes, a length from a body part of a first roll brush to a horizontal end part of the liquid blocking member is smaller than a length from a body part of a second roll brush to a horizontal start part of the liquid blocking member.

8. An apparatus for cleaning a flat panel display, the apparatus comprising:
   a cylindrical first rotation shaft;
   a first hollow cylindrical joint part having an opening for the first rotation shaft to pass therethrough;
   a first hollow cylindrical liquid blocking member being located at a first position of the first rotation shaft so as to be integrated with the first rotation shaft, and having a larger inner diameter than an outer diameter of the first hollow cylindrical joint part, wherein the first liquid blocking member is in non-contacting, spaced apart relationship with the first joint part;
   a first roll brush having a first brush located at a body part;
   a cylindrical second rotation shaft;
   a second hollow cylindrical joint part having an opening for the second rotation shaft to pass therethrough;
   a second hollow cylindrical liquid blocking member being located at a second position of the second rotation shaft so as to be integrated with the second rotation shaft, and having a larger inner diameter than an outer diameter of the second hollow cylindrical joint part, wherein the second liquid blocking member is in non-contacting, spaced apart relationship with the second joint part; and
   a second roll brush including a second brush located at a body part.

9. The apparatus of claim 8, wherein a length from a body part of the first roll brush to an end of the first liquid blocking member is smaller than a length from a body part of the second roll brush to a start end of the second liquid blocking member.

10. The apparatus of claim 8, further comprising fans provided outside the hollow cylindrical liquid blocking members.

11. The apparatus of claim 10, wherein the fan comprises a plurality of wings, and the fan is attached to and detached from the liquid blocking member.

12. A roll brush comprising:
   a cylindrical rotation shaft;
   a hollow cylindrical joint part having an opening for the rotation shaft to pass therethrough;
   a hollow cylindrical liquid blocking member being located at an outer end so as to be integrated with the rotation shaft, and having a larger inner diameter than an outer diameter of the joint part, wherein the liquid blocking member is in non-contacting, spaced apart relationship with the joint part; and
   a brush located at a body part.

13. The roll brush of claim 12, wherein an interval between the outer diameter of the joint part and the inner diameter of the liquid blocking member is equal to a vertically movable range of the roll brush.

14. The roll brush of claim 12, further comprising a fan provided outside the liquid blocking member.

15. The roll brush of claim 14, wherein the fan comprises a plurality of wings, and the fan is attached to and detached from the liquid blocking member.

* * * * *